(12) United States Patent
Zaguri

(10) Patent No.: US 7,154,331 B2
(45) Date of Patent: Dec. 26, 2006

(54) ADAPTING OPERATIONAL AMPLIFIER FREQUENCY RESPONSE RESPECTIVE TO CLOSED LOOP GAIN

(75) Inventor: Sharon Zaguri, Zichron Yakov (IL)

(73) Assignee: Intel Corporation, Santa Clara, CA (US)

( * ) Notice: Subject to any disclaimer, the term of this patent is extended or adjusted under 35 U.S.C. 154(b) by 97 days.

(21) Appl. No.: 10/881,610

(22) Filed: Jun. 29, 2004

(65) Prior Publication Data

US 2005/0285674 A1 Dec. 29, 2005

(51) Int. Cl.
*H03F 3/45* (2006.01)

(52) U.S. Cl. ...................................... 330/254; 330/260
(58) Field of Classification Search ................ 330/254, 330/257, 259, 260, 261, 278
See application file for complete search history.

(56) References Cited

U.S. PATENT DOCUMENTS

| | | | | |
|---|---|---|---|---|
| 3,737,628 A | * | 6/1973 | Azure, Jr. ................... | 434/355 |
| 4,277,974 A | * | 7/1981 | Karr et al. .................. | 374/102 |
| 4,306,198 A | * | 12/1981 | Okada ........................ | 330/260 |
| 6,930,549 B1 | * | 8/2005 | Kajiwara et al. ........... | 330/254 |

* cited by examiner

*Primary Examiner*—Henry Choe
(74) *Attorney, Agent, or Firm*—Blakely, Sokoloff, Taylor & Zafman LLP

(57) ABSTRACT

Methods and apparatuses relating to current and gain adjustment in an amplifier. A gain of an amplifier, e.g., closed loop gain, may be increased or decreased based on a swing of a received signal. A current of an internal amplifier stage may be increased or decreased in relation to the increasing or decreasing of the gain to provide adjustments to bandwidth and/or frequency response. In one embodiment a programmable gain amplifier having operational amplifier has a variable feedback resistor increased/decreased in steps and a bias current of a differential stage of the operational amplifier may be increased/decreased in proportional steps.

27 Claims, 5 Drawing Sheets

ADAPTING OPERATIONAL AMPLIFIER FREQUENCY RESPONSE RESPECTIVE TO CLOSED LOOP GAIN

FIELD

Embodiments of the invention relate to programmable gain amplifiers (PGAs), and specifically to adjusting the open loop response of an operational amplifier of a PGA in relation to adjusting the PGA closed loop gain.

BACKGROUND

Amplifiers have application in many circuits/systems. A programmable gain amplifier (PGA) allows circuit design flexibility because it allows altering amplification of an input signal. A PGA is generally a close loop (or closed loop; the terms will be used interchangeably herein) circuit having an operational amplifier (op-amp) to provide an open loop transfer function, and a network of resistive and/or capacitive elements to provide a feedback transfer function in which gain may be altered by modifying the feedback network. Traditionally operational amplifiers used in PGAs operate under a fixed gain-bandwidth product (GB). Thus, if the open loop transfer function is maintained constant, phase margin and bandwidth problems may result as closed loop gain of a system is altered by changing the feedback transfer function. The phase margin problems may be manifested in a less desirable frequency response and amplification of unwanted, out-of-band signals in a system of high gain range, and possible circuit instability. Bandwidth problems may be manifested in a close loop gain that falls to or below a desired threshold gain at a frequency within a system target bandwidth.

BRIEF DESCRIPTION OF THE DRAWINGS

The description of embodiments of the invention includes various illustrations by way of example, and not by way of limitation in the figures and accompanying drawings, in which like reference numerals refer to similar elements.

DETAILED DESCRIPTION

If an amplifier open loop gain is considered to be $A_0$, a closed loop gain may be considered to be $A_{CL}$, which is $1/\beta$, where $\beta$ is the feedback factor of the closed loop system, and represents the closed loop gain. If the dominant pole of the open-loop frequency is defined as $\omega_{p1}$, the closed loop bandwidth $\omega_{-3\,dB(CL)}$ may be written as:

$$\omega_{-3dB(CL)} = \frac{\omega_{p1} \cdot A_0}{A_{CL}} = \omega_{p1} \cdot A_0 \cdot \beta, \qquad \text{Equation (1)}$$

which may also be represented as:

$$\omega_{-3dB(CL)} = \frac{GB}{A_{CL}} = GB \cdot \beta. \qquad \text{Equation (2)}$$

This equation represents the gain bandwidth product (GB), which as the name suggests, is the product of the bandwidth, $\omega_{p1}$, and the open loop gain, $A_0$. The GB is also equivalent to the unity gain bandwidth (UGB) which is the frequency when the open loop gain is 0 dB, although the terms are often used interchangeably for any gain level. As can be seen from equation 1, as the closed loop gain increases, the available closed loop bandwidth decreases, unless one or both of the open loop gain and/or pole frequency is modified. The GB product may be modified by increasing/decreasing a biasing current of the amplifier. Thus, by dynamically altering the closed loop gain and the GB respective to each other, the gain and frequency response of a system can be controlled, while maintaining a bandwidth desired for the system.

Various references herein to an "embodiment" are to be understood as describing a particular feature, structure, or characteristic included in at least one embodiment of the invention. Thus, the appearance of phrases such as "in one embodiment," or "in alternate an embodiment" may describe various embodiments of the invention, and may not necessarily all refer to the same embodiment.

Figure 1:
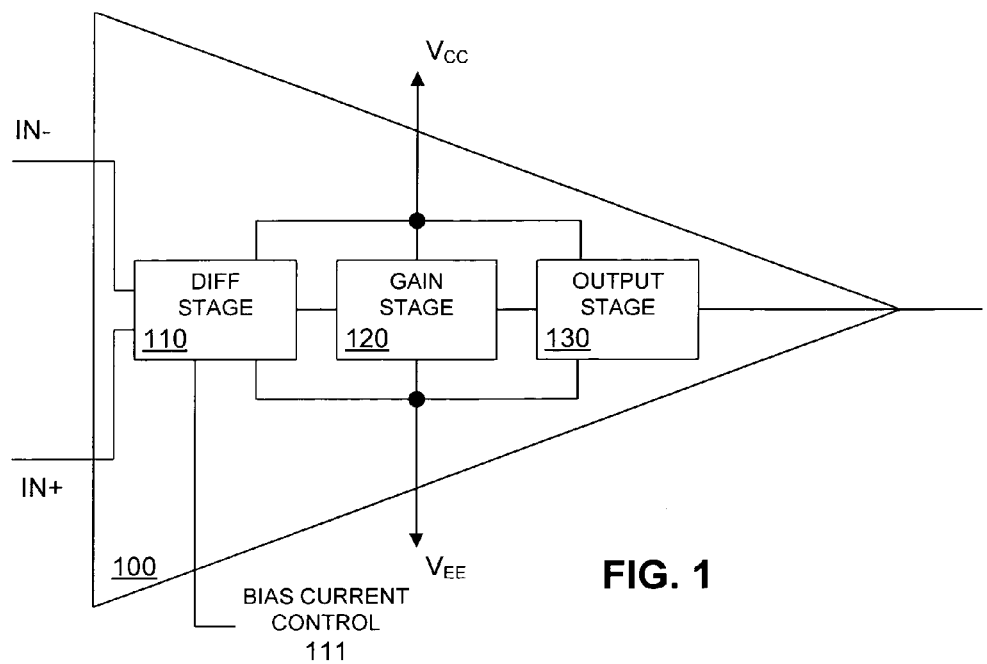
FIG. 1 is a block diagram of an amplifier with bias current control in accordance with an embodiment of the invention.

FIG. 1 is a block diagram of an amplifier with bias current control in accordance with an embodiment of the invention. Amplifier 100 may be an operational amplifier circuit, or other amplifier with high input impedance, low output impedance, and multiple amplifier stages. Amplifier 100 may represent the open loop aspect of a PGA. Amplifier 100 may have inputs In− and In+, representing an inverting and non-inverting input, respectively, of amplifier 100. Amplifier 100 is also shown with two voltage references, $V_{CC}$ and $V_{EE}$, which represent, respectively, high voltage and low voltage references. In one embodiment $V_{EE}$ is negative. Amplifier 100 may have multiple stages that represent circuits of the amplifier with different functions, for example, differential stage 110, gain stage 120, and output stage 130.

Differential stage 110, or the input stage of amplifier 100, receives the inputs In− and In+. Differential stage 110 may have a high input impedance and a difference circuit. A difference circuit functions to amplify the difference in signal potential between the two inputs. Differential stage 110 is understood to have one or more transistor circuits. The transistors may be controlled in their operation by providing a bias current. In one embodiment the bias current of input transistors of differential stage 110 is modifiable/alterable.

Bias current control 111 represents one or more signals that may be received by amplifier 100, and directed to the functioning of differential stage 110 to control the bias current.

Figure 6:
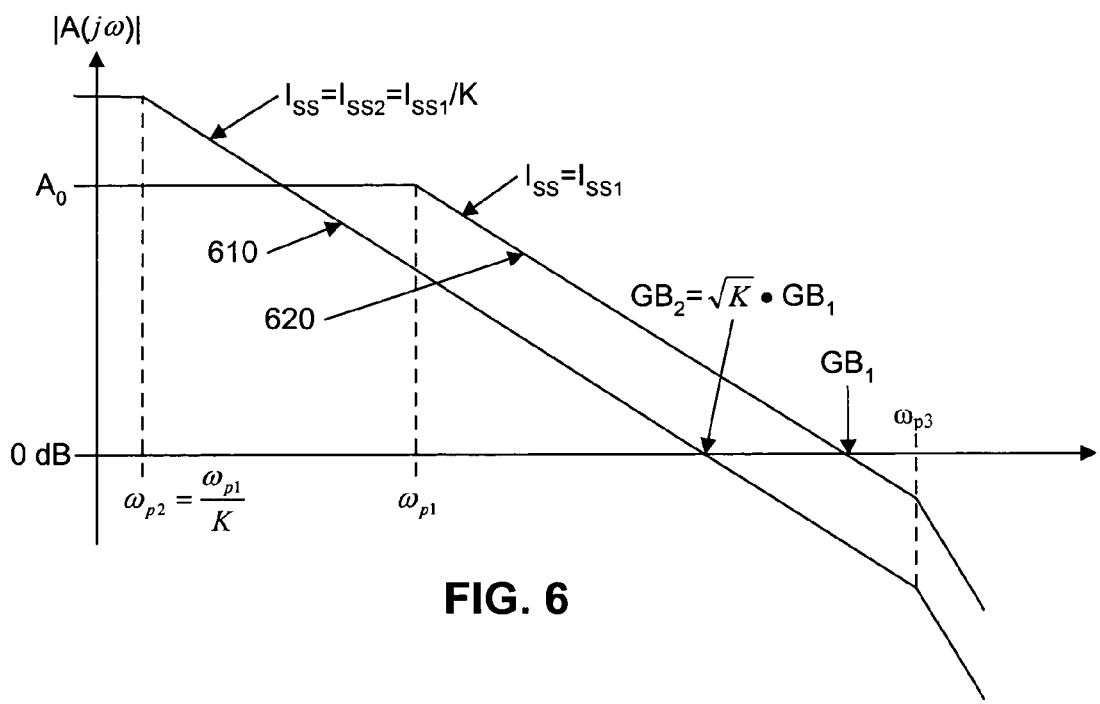
FIG. 6 is an example of gain bandwidth adjustment in a system in accordance with an embodiment of the invention.

The bias current control may dynamically alter the bias current of differential stage 110 during the operation of amplifier 100 in a circuit. Thus, amplifier 100 may operate with a particular bias during operation, and then have the bias changed to affect the frequency response of the system. The current level of differential stage 110 controls the dominant pole, as shown in FIG. 6, but leaves higher order pole(s) unaffected. This relationship is described in more detail below. Increasing the bias current moves the pole to a higher frequency and gives a larger GB, but may degrade the phase margin. Decreasing the current moves the pole to lower frequency and improves the phase margin (PM), giving smoother frequency response (e.g., reduced gain peaking near the cutoff frequency), but may degrade the frequency response (e.g., by reducing available BW).

Thus, controlling the bias current of differential stage 110 provides a mechanism to adjust a frequency parameter of amplifier 100 for different levels of gain. When gain is increased, the current may be increased to increase the GB and allow for a larger bandwidth at the higher gain level than might be achieved with lower current. The trade-off may be to experience a lower PM, and have overshoot, or gain peaking, in the frequency response curve of amplifier 100 at the lower gain levels. The gain peaking is more likely to occur in lower gain mode due to the large feedback component "β" involved with lower gain modes (recalling that β is equal to $1/A_{CL}$) which causes lower PM. This is because the "loop-gain" (explained below) magnitude reaches "0" at higher frequencies as β increases while the loop-gain phase, which is independent of β, reaches closer to 180° resulting in poorer PM.

Amplifier 100 also includes gain stage 120, which represents one or more circuit elements (e.g., transistors, resistors, capacitors) that provide an open loop gain for amplifier 100. If there is any gain associated with differential stage 110, the gain of gain stage 120 operates to multiply the differential stage gain. Gain stage 110 may provide amplifier 100 with a high open-loop gain.

In one embodiment amplifier 100 includes optional output stage 130, which represents one or more circuit elements that interface the amplified input signal(s) of differential stage 110 and gain stage 120 with a load on the output of amplifier 100. It is to be understood that output stage 130 represents a function that could be performed, for example, by circuitry of gain stage 120. These functions may include, e.g., providing output current, providing low output impedance, providing short circuit protection, etc. Thus, amplifier 100 may or may not include output stage 130 as a separate stage, and one or more functions that may be performed by output stage 130 may be included in other stages of amplifier 100.

Figure 2:
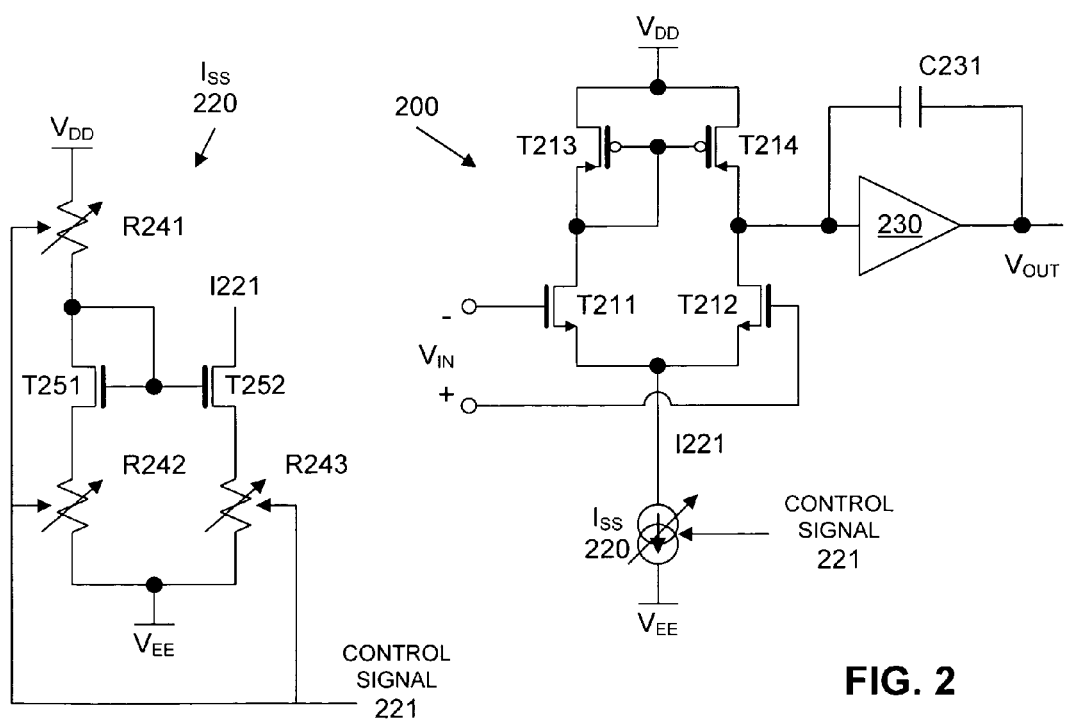
FIG. 2 is a block diagram of an amplifier with a variable current source in a differential stage in accordance with an embodiment of the invention.

FIG. 2 is a block diagram of an amplifier with a variable current source in a differential stage in accordance with an embodiment of the invention. System 200 represents circuit elements that may be part of an input stage of an amplifier. The circuit elements are not necessarily to be understood as discrete elements, but are intended to represent a simplified circuit representation of one or more elements/circuits that make up system 200. System 200 may be a simple two-stage representation of an operational amplifier (op-amp) of a PGA. System 200 may include more circuit elements than those shown in FIG. 2, including additional elements where interconnections are shown in FIG. 2.

Inputs In− and In+ are shown driving the gates of transistors T211 and T212, respectively. In one embodiment transistors T211 and T212 represent bipolar-junction transistors. In another embodiment transistors T211 and T212 are metal oxide semiconductor (MOS) transistors. Transistors T211 and T212 represent a differential pair to supply a differential signal to a transistor network. In one embodiment transistors T211 and T212 are coupled in an emitter-follower configuration with series transistor network (not shown). In another embodiment transistors T211 and T212 may be coupled with their sources coupled, and the node coupled to a current source $I_{SS}$ 220. The drains of T211 and T212 may be coupled with active current mirror load series transistors T213 and T214, which provide an output signal to a gain stage 230.

Gain stage 230 represents multiple circuit elements to provide a high open loop gain for system 200. Thus, an input voltage swing (e.g., a signal) on the input stage may produce a much greater voltage swing at the output. Gain stage 230 is shown with feedback capacitor C231, known to provide Miller compensation to the amplifier.

Current source $I_{SS}$ 220 may be coupled to the input transistor network of T211–T214. In one embodiment current source $I_{SS}$ 220 is coupled to the source of at least input transistors T211 and T212. In one embodiment current source $I_{SS}$ 220 is variable to drive an input transistor series harder or less hard to affect the dominant pole. Having a variable current source $I_{SS}$ 220 provides one mechanism to adjust the bias current of the differential stage. Control signal 221 represents one or more analog and/or digital signals received in amplifier 200 to vary the current of current source $I_{SS}$ 220. For example, control signal 221 may provide a bias for a transistor of current source $I_{SS}$ 220, (e.g., R241), set a wiper level of a variable resistor of current source $I_{SS}$ 220 (e.g., a resistor (e.g., R241) at a source of a current mirror transistor (e.g., T251), at a drain (e.g., R242 and/or R243) of a transistor, (e.g., R251 and/or T252), etc.), etc. Control signal 221 that affects current source $I_{SS}$ 220 may have at least a logical dependence on a signal controlling a closed loop gain of amplifier 200. The logical dependence may include having a number of steps of current levels equal to a number of steps of gain control. Alternatively, a number of steps of gain may be logically grouped and associated with a particular current level. Thus, a current level may correspond to multiple levels of gain.

If current source $I_{SS}$ 220 represents the current of the first, input, stage, let $g_{m1}$ be the transconductance of input transistors T211 and T212. Also let $R_I$ be the output resistance of the first stage, $A_2$ the gain of the second stage (with elements 230), and C231 the miller compensation capacitor $C_C$. Thus, the DC gain of an op-amp with the elements of system 200 is:

$$A_0 = g_{m1} R_I A_2 \qquad \text{Equation (3).}$$

The frequency of the dominant pole, where the amplifier gain is reduced to $A_0/\sqrt{2}$ is given by:

$$\omega_{p1} = \frac{1}{R_I C_C A_2}, \qquad \text{Equation (4)}$$

which is also referred to as the open loop bandwidth. The product of Equation (3) and Equation (4) equals $$A_0 \omega_{p1} = \frac{g_{m1}}{C_C} = GB,$$  Equation (5)

which is the gain bandwidth product, represented in terms of transconductance, which represents circuit-equivalent loading effects. It is important to note that because of this property, $$g_{m1} \propto \sqrt{I_{SS}}$$  Equation (6).

Thus, as per Equation (5), GB is proportional to $I_{SS}$ by the same proportion by which gm1 is proportional to $I_{SS}$. By controlling $I_{SS}$, the GB may thus be controlled.

Control signal 221 may interface directly with current source $I_{SS}$ 220 and/or be converted by an analog-to-digital converter, a digital-to-analog converter, logic, and/or discrete circuit elements. In one embodiment control signal 221 is generated by a processing unit in a device of which system 200 is a part. Thus, control signal 221 may be generated by, for example, a digital signal processor (DSP), a microcontroller, a logic array, etc.

Figure 3:
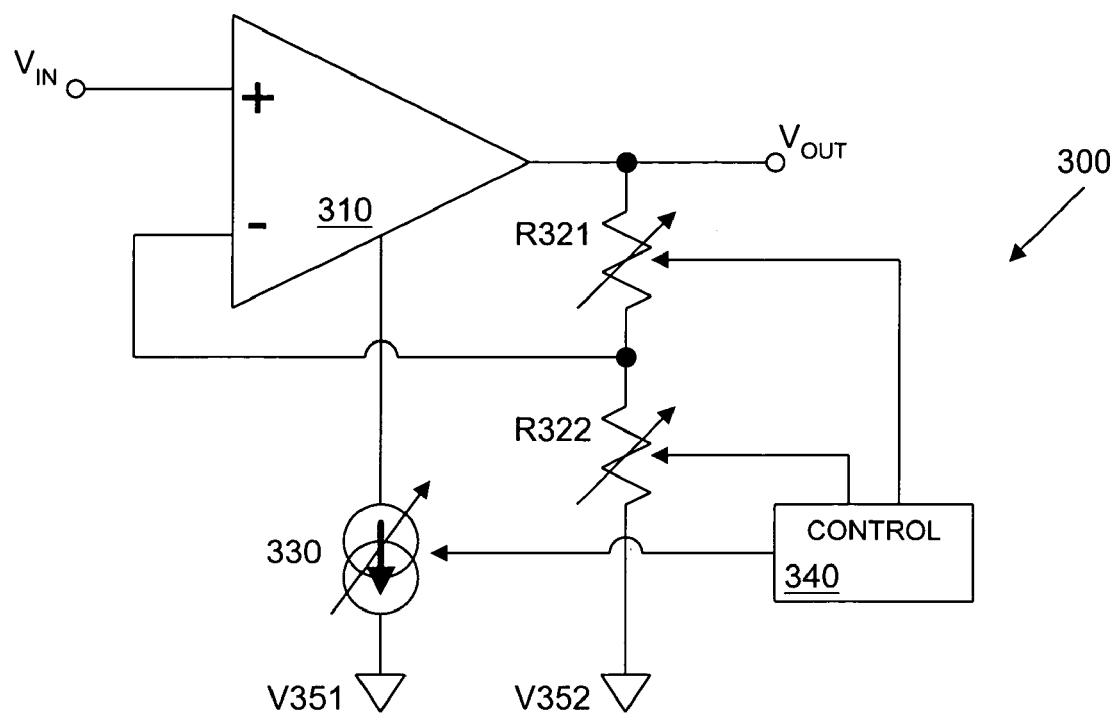
FIG. 3 is a block diagram of an amplifier circuit in closed loop configuration with a variable current source and a variable feedback resistor responsive to a control in accordance with an embodiment of the invention.

FIG. 3 is a block diagram of an amplifier circuit in closed loop configuration with a variable current source and a variable resistor responsive to a control in accordance with an embodiment of the invention. System 300 represents amplifier 310 in a closed loop configuration, with a negative feedback network represented by resistors R321 and R322. Resistor R321 is shown placed between the output and the inverting terminal of amplifier 310, in the feedback path, and a R322 is shown placed on the inverting terminal of amplifier 310. Amplifier 310 may be set to operate in a differential, inverting, or non-inverting mode. Note that feedback resistor R320 lowers the gain of amplifier 310 and provides increased stability to the circuit over an open loop configuration. One or more discrete resistor elements of the feedback resistor network represented by resistor R320 may be variable, or a potentiometer, and have a digital and/or analog control to vary the resistance of the feedback loop. Because feedback resistor network is variable in that resistor R321 and/or R322 may be dynamically altered, system 300 could be considered a programmable gain amplifier (PGA). Note that a PGA, such as system 300, may be designed with discrete components, or may be a unitary device with all components integrated into a single device.

Because the gain of system 300 is generally related to the resistance of feedback resistors R321 and R322 and the closed loop gain may be controllable by controlling the value of one or more of these resistors. For example, adjusting the value of resistor R321 may act to adjust the gain of amplifier 310, or system 300. Resistor R321 may have minimum and/or maximum setting to which it may be set for a particular design. Thus, in one embodiment system 300 has a minimum and maximum close loop gain. For example, a maximum close loop gain of system 300 may be 12, 16, 20, etc. The gain adjustment may be continuous, or may be discretely stepped. For example, a digital signal may be used to control R320 to one of 20 or 30 levels, the levels stepping the resistance ratio of R321 and R322, and thus stepping the close loop gain. In one embodiment each step is of equal resistance. In another embodiment, each step is of equal gain increase/decrease (e.g., 1.0 dB, 1.5 dB, 2.0 dB).

Recall from Equations (1) and (2) that the GB is equal to the 3 dB cutoff frequency, $\omega_{-3\ dB}$ multiplied by the close loop gain $A_{CL}$. Thus increasing the close loop gain by adjusting the resistor feedback network results in decreasing the cutoff frequency, and hence, lowering the bandwidth. This is because GB is a constant (unless altered, for example, by increasing the current of the input stage as described herein), making the cutoff frequency and the close loop gain to share an inverse proportionality relationship. Thus, by adjusting a variable current of an open loop circuit, GB can be increased to provide extra bandwidth at higher gains, and reduced at lower gains to provide better phase response.

System 300 also may include variable current source 330, which represents a current source coupled with amplifier 310 and/or part of a stage of amplifier 310, and coupled with a voltage reference V351. In one embodiment voltage reference V351 represents a negative voltage power supply. Note that reference R351 may be the same as the reference V352 coupled to the feedback network, although it may not be. Although shown as external to amplifier 310, current source 330 may not necessarily be external to amplifier 310, and may simply represent the capacity to adjust the current of amplifier 310 to adjust circuit responses of system 300.

Control 340 represents a circuit, controller, processor, etc., that provides control signals to determine a level of close loop gain provided by system 300 by varying resistor network R321 and R322. In one embodiment control 340 represents circuitry internal to a PGA device of which system 300 is a part. Alternately, control 340 represents circuitry external to a physical device that has amplifier 310, resistors R321 and R322, and current source 330. Control signals are generated and/or executed by control 340 to set a wiper of resistors R321 and R322. Control 340 may also control current source 330. In one embodiment control 340 provides the same control signal to each of current source 330, resistor R321, and resistor R322. Alternately, one or more additional control signals specific to a particular device may be generated.

In one embodiment control 340 adjusts current source 330 and the resistor network in relation to each other. For example, if the resistor network is set to provide a higher gain to system 300, current source 330 may be correspondingly set to provide higher bias current to amplifier 310. In one embodiment, current source 330 has the same number of adjustment steps as one or more of resistors R321 and/or R322. Thus, the adjustments to resistors R321 and/or R322 and current source 330 may be set proportionally to each other. For example, resistor R321 may have 20 steps that provide 20 levels of closed loop gain, and current source 330 may also provide 20 steps to provide 20 levels of bias current. In such a case, step 10 of resistor R321 may correspond to step 10 of current source 330, and both could be set to the same step by control 340. For example, keeping the proportion of gain to GB or alternatively, gain to the square root of $I_{SS}$, may involve increasing gain by 2 while increasing the current by 4. Thus, in one embodiment the proportion may be a square relationship.

In an alternate embodiment, current source 330 may be controlled in various steps, but fewer steps than the levels of gain. Various levels of gain may be associated with the same level of current. For example, if R321 had 20 steps that provided 20 level of closed loop gain, and current source 330 had 4 steps to provide 4 levels of bias current, various steps of resistivity (e.g., 4, 5, 6) may all be associated with one of the levels of current. The gain levels may be logically grouped, and a level of current may correspond to a logical group of gain levels.

Figure 4:
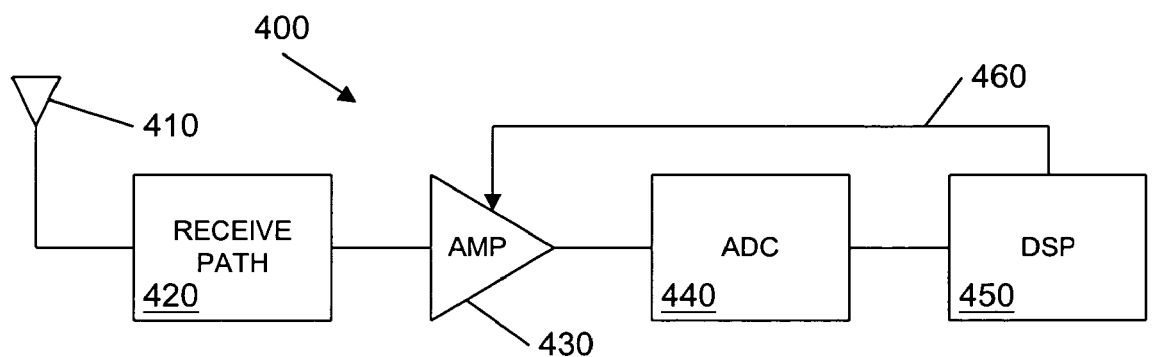
FIG. 4 is a block diagram of a radio frequency receiver in accordance with an embodiment of the invention.

FIG. 4 is a block diagram of a radio frequency receiver in accordance with an embodiment of the invention. System 400 may be a system that makes part of a radio receiver circuit. System 400 may receive signals of various different digital signal protocols. When signals are received by system 400, they may be from remote devices that are close or far from system 400. When a signal is received from a remote device that is far away, the signal strength may be weak relative to a signal that is received from a closer device. The signal swing of a stronger signal will be larger than the signal swing of a weaker signal.

Antenna 410 represents one or more antennae elements to receive a signal. Receive path 420 represents one or more signal conductors, circuit elements, etc. that provide a receive path to conduct the received signal from antenna 410 to amplifier 430. Amplifier 430 may be close loop amplifier with one or more elements according to one of the previous figures discussed above. Amplifier 430 provides amplification of the received signal for ADC 440. ADC 440 has a range of input that may be fixed. Thus, to prevent signal clipping, an input signal should be below a maximum range threshold. Likewise, to reduce the effects of quantization noise, the signal should be large enough is signal swing to provide sufficient resolution for a digital representation of the peaks and valleys of the signal. Quantization noise problems refer to the fact that an analog to digital converter has discrete steps or levels of digital resolution for converting analog signals; small signals may not produce enough voltage swing to provide sufficient resolution for the digital signal produced by the ADC to effectively represent the analog signal.

In one embodiment amplifier 430 should attempt to amplify signals coming in from receive path 420 to allow each signal to take advantage of the maximum resolution of ADC 440. Thus, signals coming in from a strong source that produce a large voltage swing may need less amplification than a signal received from a weaker source that produces a smaller voltage swing. By amplifying the weaker signal more, both the stronger and the weaker signal can be made to utilize more efficiently the resolution available in ADC 440.

Note that while amplifier 430 is represented with a single block element in FIG. 4, amplifier 430 may have multiple amplifiers, multiple stages of amplifiers, etc. In one embodiment amplifier 430 represents multiple amplifier stages, each a PGA. If each amplifier were programmable, they may have the same level of gain assigned, or operate with different levels of amplification. Thus, control signal 460 may represent one or multiple control line, control signal buses, etc., that direct or program the gain of an amplifier stage of amplifier 430. Note that control signal 460 may similarly control an operating current of one or more amplifier elements of amplifier 430.

The amplified signal is passed to ADC 440, as discussed above, for conversion to a digital representation, for digital processing. In one embodiment substantially the maximum range of ADC 440 is used with signals of varying strength, making it possible to provide a similar level of accuracy in digital representation and subsequent signal processing for each signal strength level. DSP 450 represents a digital signal processor, controller, etc., that processes the amplified and converted signals, and potentially forwards the signal and/or a processed version of the signal to other levels, such as applications, other processors, etc.

In one embodiment DSP 450 is able to determine, relative to the receive signal path shown, or another signal path, a signal strength of a received signal. When the signal strength is determined, DSP 450 may determine an appropriate level of gain and/or bias/operating current to provide amplification to provide a signal of good swing to ADC 440. DSP 450 may detect that ADC 440 is not maximized and cause system gain at amplifier 430 to be increased. For example, DSP 450 may probe ADC 440 to determine the level of utilization of its resolution. In one embodiment DSP 450 specifies a level for one or gain or bias current, and amplifier 430 determines based on the level set for the one, an appropriate level for the other. Such a determination may also be made by DSP 450. In one embodiment a signal strength is determined by another processing device/circuit and reported/indicated to DSP 450.

Figure 5:
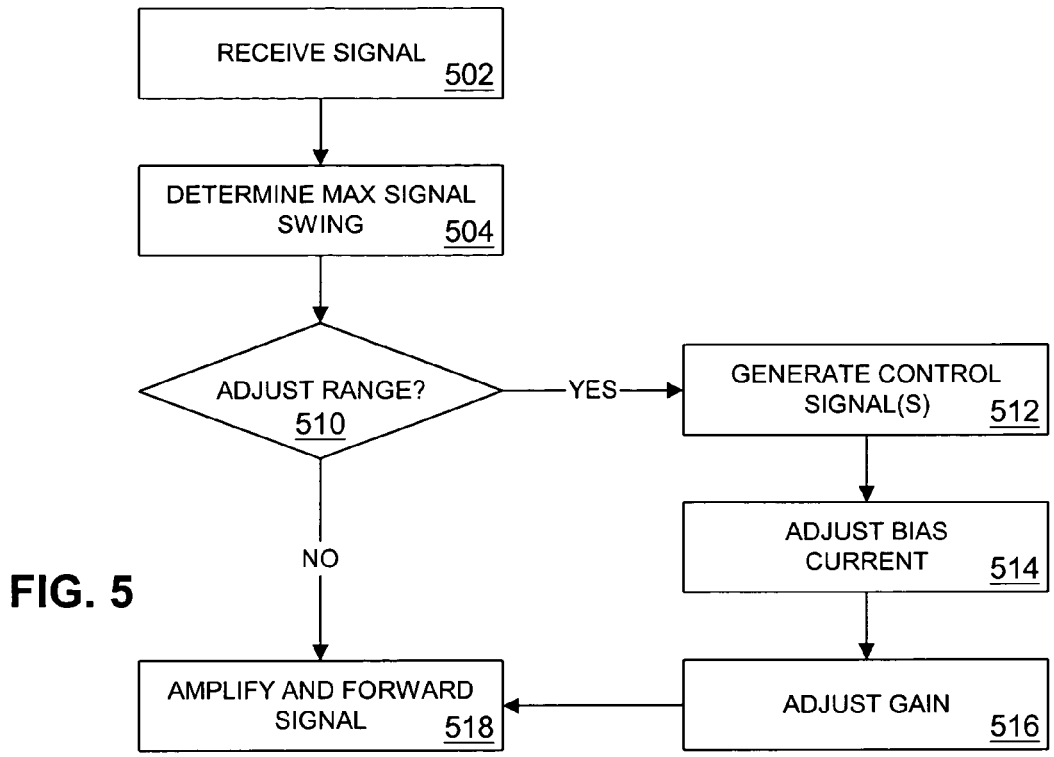
FIG. 5 is a flow diagram of adjusting a closed loop gain and an amplifier operating current in accordance with an embodiment of the invention.

FIG. 5 is a flow diagram of adjusting a closed loop gain and an amplifier operating current in accordance with an embodiment of the invention. A signal is received, 502. In one embodiment a receive DSP determines a signal strength of the receive signal, 504. The determining the signal strength may include determining from a signal strength indicator an expected maximum signal swing, or vice versa. The signal swing may be desired to match a range on an ADC to which the signal will be input.

A determination may be made, based at least in part on the signal strength, whether a range of the signal should be adjusted, 510. Whether the range should be adjusted may depend at least in part on determining a range of ADC bits that may be utilized by the signal swing, and whether a different range might be more desirable. If a programmable gain amplifier circuit is provided before an ADC stage, the gain stage may provide a level of current and/or a gain for the amplifier.

If the range of the signal is to be adjusted, one or more control signals may be generated, 512. Generating control signals may refer to one or more processes/operations/actions that may be taken to alter/modify how the system will process the signal. For example, it may include providing settings at a signal processing element, generating a control signal(s) to indicate a gain and/or bias current modification, etc. Signals may be specific to a device and/or be generic to multiple devices associated with gain/current adjustments. A control signal may indicate a specific action at/by a device, or may simply indicate a desired system state, which the device may interpret and make appropriate adjustments corresponding to the desired state to result in the system achieving the desired state.

In one embodiment logic may be used to provide control signals. The control signals may represent control signals generated by logic, a processor, etc., or it may represent a group of logic operations occurring from the use of a preprogrammed table, lookup table, etc. In addition, the providing of signals and/or the response of an amplifier system may be automatic. An automatic response may be one that does not require processing. For example, circuitry and/or logic may trigger when signal strength is lost and/or when a signal begins to clip. The triggering may result in the system increasing/decreasing current and/or gain to automatically target the received signal to the receive path, including an analog to digital converter, a signal processor, or other receive path elements.

In conjunction with, or in response to one or more actions taken to adjust the signal range, a current of a stage of an op-amp of a PGA circuit may be adjusted, 514. The current may be adjusted higher or lower, depending on the signal strength, to adjust for smoother frequency response (e.g., in low gain situations) or higher GB (e.g., in high gain situations). An operating current of a first stage, often referred to as a differential amplifier stage, of an op-amp of a PGA may be adjusted to move a dominant pole of a frequency response characteristic of the PGA (the dominant pole affects GB).

The closed loop gain of the amplifier may also be adjusted in conjunction with, or in response to one or more actions take to adjust the signal range, 516. Adjusting the range may be performed to prevent clipping, reduce quantization noise, etc. If the range is not to be adjusted or if adjustments have been made, the signal may be amplified according to the gain/current settings in effect in the amplifier, and the signal forwarded to one or more other circuits, 518. For example, the signal may be input to an ADC for preparation for signal processing.

FIG. 6 is an example of gain bandwidth adjustment in a system in accordance with an embodiment of the invention. Closed loop gain $|A(j\omega)|$ is theoretically plotted against frequency. Consider curve 620, which represents the response curve of the system operating with a current of $I_{SS}=I_{SS1}$, some relatively high operating current for the amplifier of the system. A gain of $A_0$ is realized, and a knee representing the frequency of the dominant pole is shown at $\omega_{p1}$. Curve 620 has an associated gain bandwidth product $GB_1$, and a second pole at $\omega_{p3}$.

Curve 620 may be contrasted with curve 610, which represents the response curve of the system operating with a lower current than curve 620, specifically, $I_{SS}=I_{SS2}=I_{SS1}/K$, where K is a number greater than 1 that represents the ratio of $I_{SS1}$ to $I_{SS2}$. Note that at the lower current $I_{SS2}$, the first and dominant pole is moved with respect to the dominant pole of curve 620. The frequency of the dominant pole of curve 610 is shown at $\omega_{p2}=\omega_{p1}/K$. Assume that in one embodiment $\omega_{p1}$ indicates a frequency approximately at the system required bandwidth. Because of the shift of the dominant pole on curve 610 with the lower operating current, curve 610 does not achieve the required system bandwidth at as high a gain level on the curve. In fact, curve 610 is shown to have a lower gain level to achieve the same bandwidth. While the dominant pole may shift, and produce a different GB, and so different frequency to gain level characteristics, the second poles at $\omega_{p3}$ is the same for both curves 610 and 620.

Figure 7:
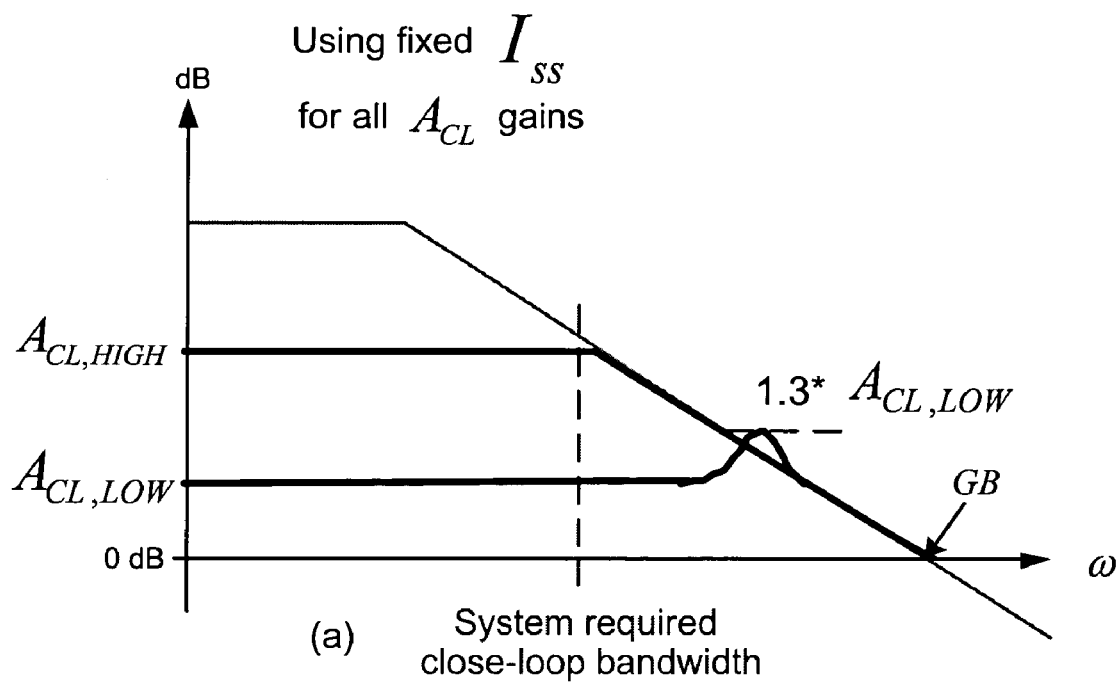
FIG. 7 is an example of gain bandwidth and frequency response of different closed loop gains in accordance with an embodiment of the invention.
Figure 7:
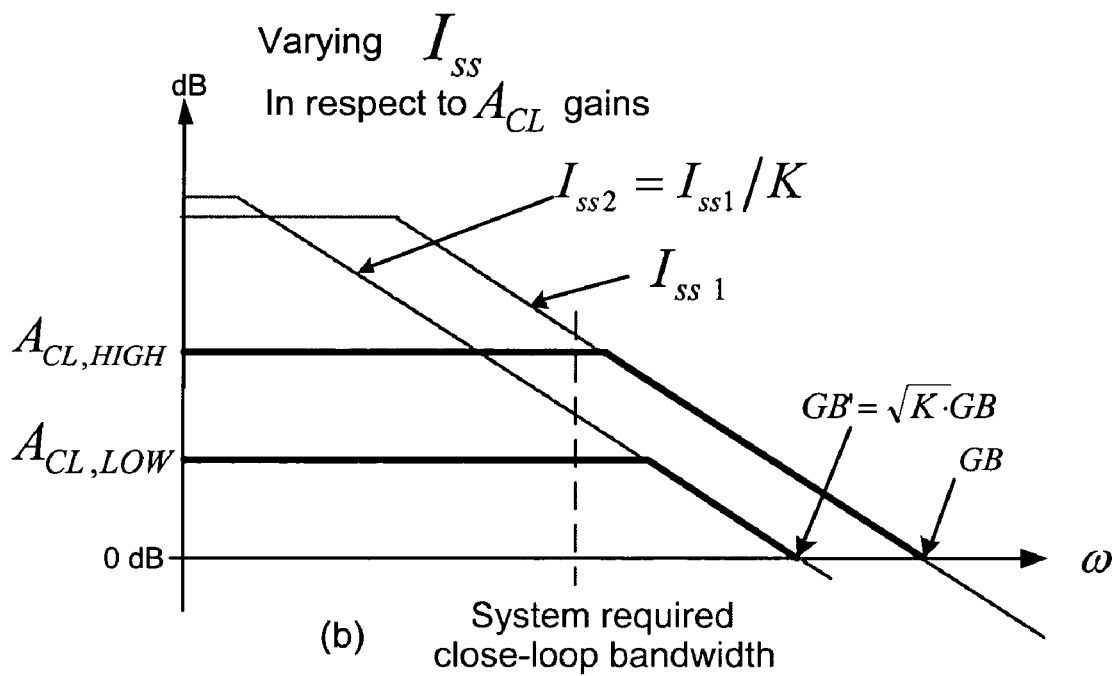

FIG. 7 is an example of gain bandwidth and frequency response of different closed loop gains in accordance with an embodiment of the invention. Graph (a) describes a frequency response of two closed-loop gain levels, $A_{CL,HIGH}$ and $A_{CL,LOW}$ of a PGA with fixed first stage operating current $I_{SS}$. This results in the system having a fixed GB. In one embodiment the two gain levels shown represent a minimum and a maximum gain modes that satisfy the system bandwidth requirements. The bandwidth of the low closed-loop gain mode can be seen to be higher than that of the high gain mode, because with fixed GB, as $A_{CL}$ decreases, bandwidth increases.

Thus, in the low gain mode there is excessive bandwidth. However, the low gain mode may suffer from large gain peaks in the out-of-band frequencies due to poor PM. For example, a peak of 30% of the gain level of the low gain mode may be seen for a PM equal to 45 degrees. This gain peak may amplify unwanted out-of-band signals and have an unwanted effect on the system employing the PGA. In the high closed loop gain mode, the PM is much higher, and there may be no peaking.

In graph (b), the first stage operating current $I_{SS}$ is varied in relation to the closed loop gain. Thus, a different GB may be used for different gain modes. As shown in the graph, when $I_{SS1}$ is used for the high gain mode, the system required bandwidth may be achieved. In a low gain mode, a new current $I_{SS2}$ may be used, with $I_{SS1}>I_{SS2}$, resulting in a reduced GB by using $I_{SS2}$. Note that GB is not fixed, and the system frequency response may be controllable.

Figure 8:
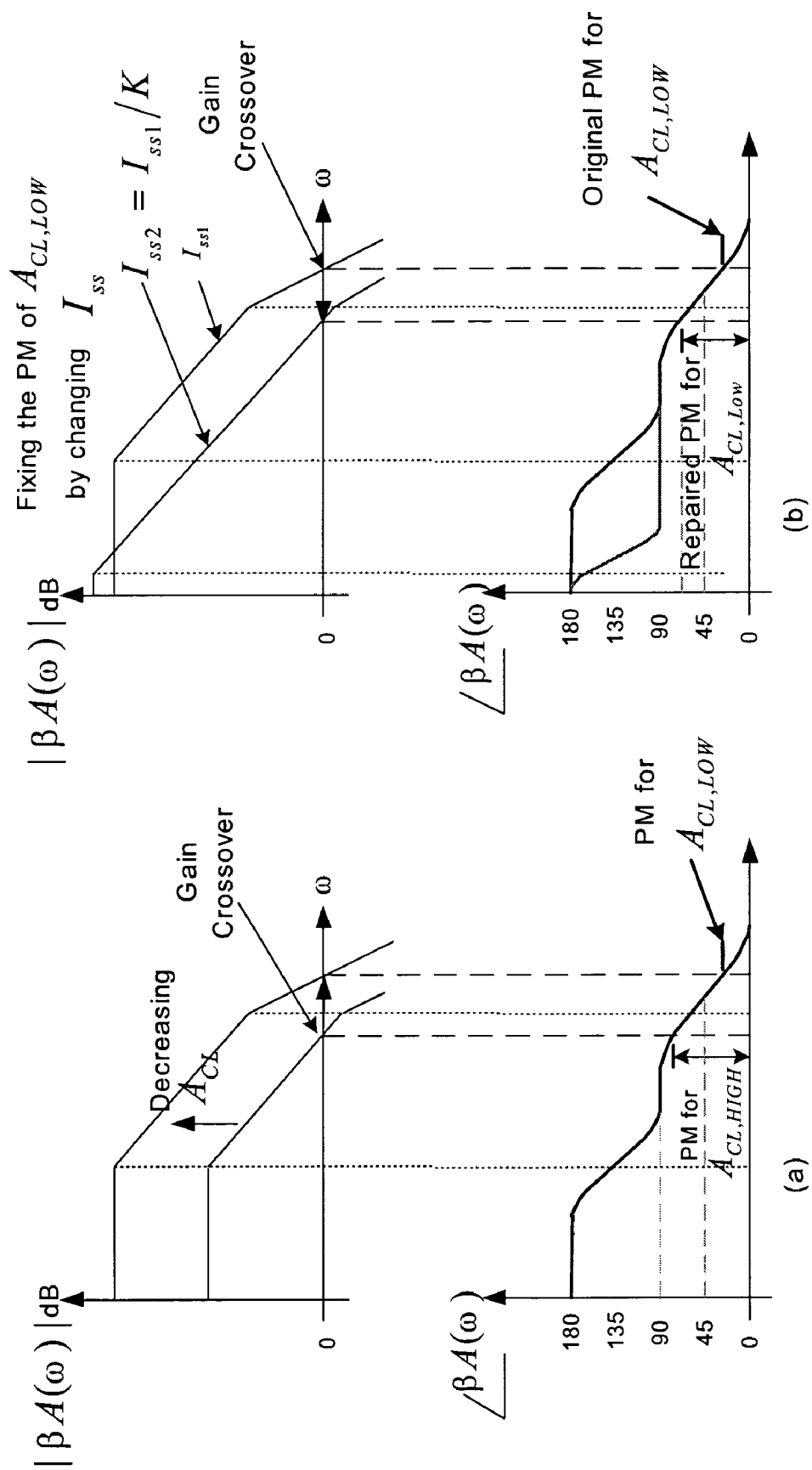
FIG. 8 is an example of loop gain and phase margin comparison of a system operating under different current levels in accordance with an embodiment of the invention.

FIG. 8 is an example of loop gain and phase margin comparison of a system operating under different current levels in accordance with an embodiment of the invention. Graph (a) describes the PM of a PGA in two closed loop gain modes. For PM, the loop gain magnitude $|\beta A(\omega)|$ and the phase $\angle \beta A(\omega)$ are plotted with each other. As shown in FIG. 8, graph (a), when the closed loop gain decreases, $\beta$ increases to result in a higher magnitude plot. For the high closed loop gain, PM may be approximately at or above 60°, but when the PGA uses a lower gain mode, the feedback factor $\beta$ becomes stronger. As $\beta$ becomes stronger, the gain crossover point of the loop gain moves away from the origin, resulting in a lower PM. The lower PM may cause gain peaking, and the system may become unstable if the PM gets too close to 0°.

Graph (b) shows reducing the operating current ISS and reducing GB for lower gain modes. The result, as seen from FIG. 8, is that the gain crossover point moves closer to the origin while the frequency crossover point remains constant. In this way, the PM margin may be improved, for example, maintained above 60°, and the low closed loop gain mode may not suffer peaking.

Besides what is described herein, it will be appreciated that various modifications may be made to embodiments of the invention without departing from their scope. Therefore, the illustrations and examples herein should be construed in an illustrative, and not a restrictive sense. The scope of the invention should be measured solely by reference to the claims that follow.

What is claimed is:

1. A method comprising:
   adjusting a gain of an operational amplifier stage; the gain of the operational amplifier stage having a corresponding frequency response according to a gain bandwidth product of the operational amplifier stage and
   adjusting a bias current of transistors of a differential stage of the operational amplifier stage respectively to the gain adjustment, to modify the gain bandwidth product of the operational amplifier stage to adjust a frequency response of the operational amplifier stage in response to the adjusted gain wherein adjusting the bias current includes adjusting a variable resistor to one of multiple discrete wiper settings.

2. A method according to claim 1, wherein adjusting the bias current further comprises adjusting a current source to a current output level corresponding to the one discrete wiper setting.

3. A method according to claim 2, wherein adjusting the current source to the corresponding current level comprises adjusting the current source to a current level that corresponds to only the one discrete wiper setting.

4. A method according to claim 2, wherein adjusting the current source to the corresponding current level comprises adjusting the current source to a current level that corresponds to multiple wiper settings.

5. A method according to claim 1, wherein adjusting the gain of the amplifier stage comprises adjusting the gain of a signal input stage of the operational amplifier.

6. A method according to claim 1, wherein adjusting the bias current respectively to the gain adjustment comprises adjusting the bias current to a percent of a maximum current output proportional to a percent of maximum gain to which the gain adjustment is set.

7. A method according to claim 6, wherein adjusting the bias current proportionally to the gain comprises setting current to a level to provide a bandwidth sufficient to amplify a specified passband at the gain level.

8. An apparatus comprising:
an operational amplifier circuit a gain of the operational amplifier being adjustable, the gain having a corresponding bandwidth in accordance with a gain bandwidth product of the operational amplifier;
an adjustable current source coupled to the operational amplifier to provide an adjustable current to the operational amplifier circuit, to modify the gain bandwidth product of the operational amplifier to adjust the bandwidth corresponding to the gain, including adjusting a programmable resistor in a current mirror circuit of the current source in response to a control signal of a control circuit; and
an adjustable gain control circuit to control the gain of the operational amplifier, the gain control to be adjusted corresponding to an adjustment of the current.

9. An apparatus according to claim 8, wherein the control circuit controls the programmable resistor in the current mirror in relation to a level programmed for a variable resistor in a feedback loop of the operational amplifier.

10. An apparatus according to claim 8, wherein the adjustable current source provides a current setting for multiple different gain settings.

11. An apparatus according to claim 8, wherein the adjustable current source comprises a current source in a differential stage of the operational amplifier.

12. A system comprising:
an amplifier having
an operational amplifier having a modifiable gain, the gain to be modified according to a control signal received at the operational amplifier, the gain having a corresponding bandwidth in accordance with a gain bandwidth product of the operational amplifier; and
a current generator coupled to the operational amplifier to supply an operating current of one of variable levels to the operational amplifier, the level of current based at least in part on the gain the level of current to provide the gain bandwidth product with the corresponding bandwidth in accordance with the gain; and
an analog to digital converter (ADC) coupled to the amplifier to receive an amplified signal from the amplifier.

13. A system according to claim 12, wherein the gain to be modified according to a control signal comprises the gain to be modified to amplify a received data signal to result in the amplified data signal having a signal swing approximately equal to an input range of the ADC.

14. A system according to claim 12, wherein the gain is modified to one or multiple discrete levels of gain.

15. A system according to claim 14, wherein one discrete level of gain comprises approximately 1.0 dB of gain.

16. A system according to claim 12, wherein supplying the level of current based at least in part on the gain comprises supplying a higher current when the gain is modified to a higher level.

17. A system according to claim 16, wherein supplying a higher current with a higher gain comprises increasing the current to a percentage of a maximum current corresponding to a percentage of maximum gain to which the gain is increased.

18. A system according to claim 16, further comprising categorizing the levels of gain into groups, and wherein supplying the level of current based on the gain comprises supplying one of four current levels to a group.

19. A wireless receive path comprising:
a receive antenna to receive a signal;
an amplifier coupled with the antenna to amplify the signal, the amplifier having a dynamically adjustable first-stage current and a dynamically adjustable gain, the gain having a corresponding frequency response in accordance with a gain bandwidth product of the amplifier, the gain and the current to be adjusted in relation to each other, an adjustment to the current to modify the gain bandwidth product and the corresponding frequency response in relation to an adjustment to the gain, based at least in part on a signal range of the signal; and
an analog to digital converter (ADC) coupled with the amplifier to convert the amplified signal to a digital representation.

20. A wireless receive path according to claim 19, wherein the gain and current are increased in relation to each other when the signal range is low.

21. A wireless receive path according to claim 20, wherein the gain and current are increased in equal proportions.

22. A wireless receive path according to claim 19, wherein the gain and current are decreased in relation to each other if the signal range causes clipping.

23. A wireless receive path according to claim 19, wherein the first stage current has fewer steps of adjustment than a number of steps of gain adjustment, and wherein one step of current adjustment corresponds to multiple steps of gain adjustment.

24. A wireless receive path according to claim 19, further comprising a digital signal processor coupled with the ADC to process the converted amplified signal.

25. A method comprising:
determining a signal strength of a signal received on a radio frequency receiver;
altering a gain of a programmable gain amplifier (PGA) in response to determining the signal strength the gain having a corresponding frequency response in accordance with a gain bandwidth product of the PGA; and
altering a bias current of an operational amplifier differential stage of the PGA proportionally to the gain alteration to modify the gain bandwidth product of the PGA, to adjust a frequency response of the PGA proportionally to the gain alteration.

26. A method according to claim 25, wherein altering the gain and the bias current further comprises generating a digital control signal to indicate a gain and bias current alteration.

27. A method according to claim 25, wherein altering the bias current proportionally to the gain alteration comprises altering the bias current to a discrete bias current level corresponding to at least one discrete gain level to which the PGA is altered.

* * * * *

UNITED STATES PATENT AND TRADEMARK OFFICE
CERTIFICATE OF CORRECTION

PATENT NO.        : 7,154,331 B2  
APPLICATION NO.   : 10/881610  
DATED             : December 26, 2006  
INVENTOR(S)       : Zaguri It is certified that error appears in the above-identified patent and that said Letters Patent is hereby corrected as shown below:

In column 11, at line 41, After "gain", insert --,--.  
In column 11, at line 44, After "strength", insert --,--.

Signed and Sealed this

Second Day of September, 2008

JON W. DUDAS  
*Director of the United States Patent and Trademark Office*